United States Patent
Li et al.

(10) Patent No.: US 10,177,143 B2
(45) Date of Patent: Jan. 8, 2019

(54) FINFET DEVICE AND METHOD FOR FABRICATING THE SAME

(71) Applicant: TAIWAN SEMICONDUCTOR MANUFACTURING CO., LTD., Hsinchu (TW)

(72) Inventors: Chii-Horng Li, Hsinchu County (TW); Chien-I Kuo, Chiayi County (TW); Lilly Su, Hsinchu County (TW); Chien-Chang Su, Kaohsiung (TW); Ying-Wei Li, Taichung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/925,479

(22) Filed: Oct. 28, 2015

(65) Prior Publication Data
US 2017/0125410 A1 May 4, 2017

(51) Int. Cl.
*H01L 27/088* (2006.01)
*H01L 21/8234* (2006.01)
*H01L 29/08* (2006.01)

(52) U.S. Cl.
CPC .. *H01L 27/0886* (2013.01); *H01L 21/823431* (2013.01); *H01L 21/823481* (2013.01); *H01L 29/0847* (2013.01)

(58) Field of Classification Search
CPC .......................... H01L 29/0847; H01L 27/0886
USPC ........................................................ 257/401
See application file for complete search history.

(56) References Cited

U.S. PATENT DOCUMENTS

| | | | | |
|---|---|---|---|---|
| 8,592,280 | B2 * | 11/2013 | Chang | H01L 29/66545 257/346 |
| 9,318,581 | B1 * | 4/2016 | Guo | H01L 29/7853 257/346 |
| 2008/0290391 | A1 * | 11/2008 | Hsu | H01L 21/28282 257/315 |
| 2009/0302372 | A1 * | 12/2009 | Chang | H01L 29/66545 257/327 |
| 2011/0198676 | A1 * | 8/2011 | Luo | H01L 29/7851 257/288 |
| 2011/0210404 | A1 * | 9/2011 | Su | H01L 29/785 257/401 |
| 2011/0298058 | A1 * | 12/2011 | Kawasaki | H01L 29/7853 257/401 |

(Continued)

*Primary Examiner* — Moazzam Hossain
(74) *Attorney, Agent, or Firm* — Cooper Legal Group, LLC

(57) ABSTRACT

A semiconductor device includes a semiconductor substrate, at least one first isolation structure, at least one second isolation structure, a source structure, a drain structure and a plurality of semiconductor fins. The first isolation structure and the second isolation structure are located on the semiconductor substrate. The source structure is located on the semiconductor substrate and the first isolation structure, in which at least one first gap is located between the source structure and the first isolation structure. The drain structure is located on the semiconductor substrate and the second isolation structure, in which at least one second gap is located between the drain structure and the second isolation structure. The semiconductor fins protrude from the semiconductor substrate, in which the semiconductor fins are spaced apart from each other, and connect the source structure and the drain structure.

18 Claims, 21 Drawing Sheets

(56) References Cited

U.S. PATENT DOCUMENTS

| | | | | |
|---|---|---|---|---|
| 2012/0091538 A1* | 4/2012 | Lin | ................... | H01L 29/66795 |
| | | | | 257/401 |
| 2012/0138886 A1* | 6/2012 | Kuhn | ..................... | B82Y 10/00 |
| | | | | 257/9 |
| 2013/0187206 A1* | 7/2013 | Mor | ................. | H01L 29/66628 |
| | | | | 257/288 |
| 2013/0187228 A1* | 7/2013 | Xie | ...................... | H01L 29/785 |
| | | | | 257/347 |
| 2014/0151746 A1* | 6/2014 | Loubet | .............. | H01L 29/66795 |
| | | | | 257/192 |
| 2014/0217517 A1* | 8/2014 | Cai | ..................... | H01L 27/0886 |
| | | | | 257/401 |
| 2014/0264725 A1* | 9/2014 | Chuang | ............... | H01L 29/0649 |
| | | | | 257/510 |
| 2015/0318399 A1* | 11/2015 | Jeong | ................. | H01L 29/7853 |
| | | | | 257/401 |
| 2015/0333061 A1* | 11/2015 | Kim | .................... | H01L 27/0886 |
| | | | | 257/401 |
| 2016/0329429 A1* | 11/2016 | Cheng | ................ | H01L 29/7851 |

\* cited by examiner

FINFET DEVICE AND METHOD FOR FABRICATING THE SAME

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
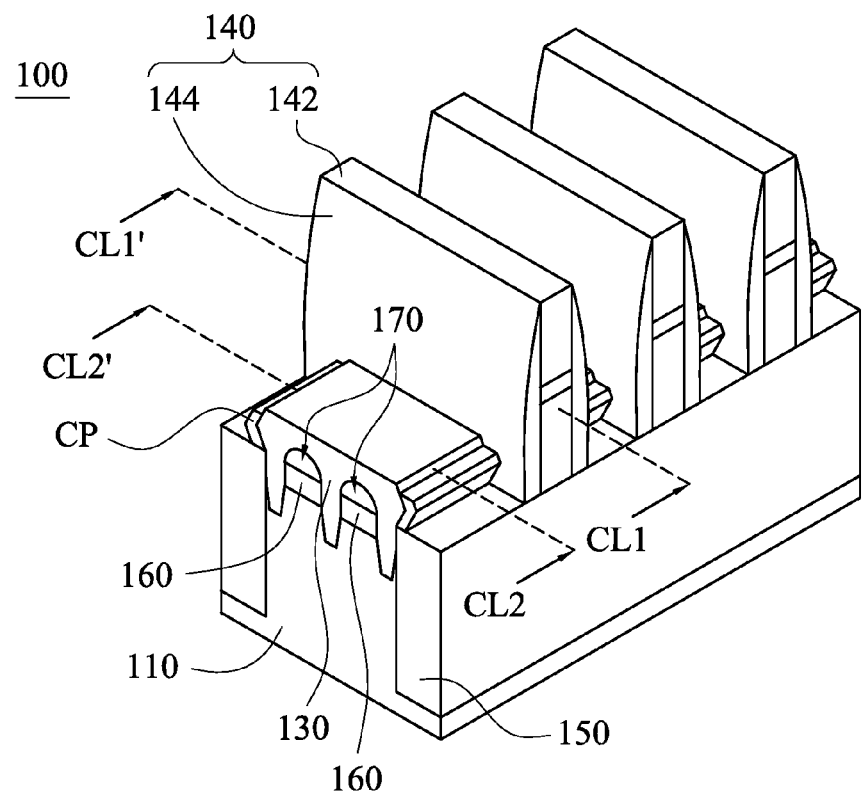
FIG. 1A is a schematic three-dimensional diagram showing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a method for fabricating a fin-like field-effect transistor (FinFET) device. In the method, at first, a semiconductor substrate is provided. Then, plural semiconductor fins protruding from the semiconductor substrate are formed. Thereafter, a plurality of isolation structures are formed on the semiconductor substrate to space the semiconductor fins apart from each other. Then, a plurality of gate structures are formed across the semiconductor fins, and thus portions of the semiconductor fins are protected by the gate structures. Thereafter, portions of the semiconductor fins not protected by the gate structures are removed, and the isolation structures are reserved. Then, a plurality of source/drain structures are formed on the semiconductor substrate and the isolation structures to enable a gap to be formed between each of the source/drain structures and each of the isolation structures. The gap is configured to prevent out-diffusion of dopant element into the bottoms of the semiconductor fins, and produce better intra-fin isolation to reduce leakage current, and prevent the semiconductor fins from bending when the semiconductor fins are too high, and provide better Area/Capacitance performance.

Figure 1B:
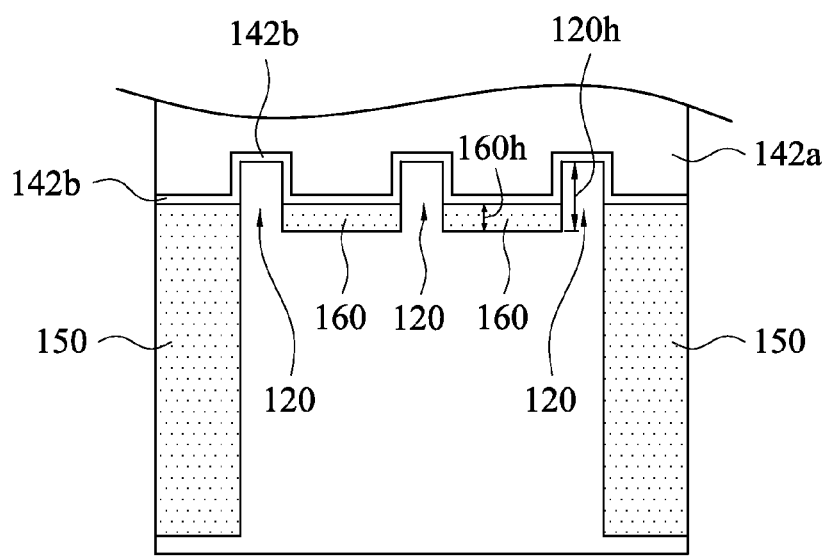
FIG. 1B is a cross-sectional view of the semiconductor device viewed along line CL1-CL1' in FIG. 1A.
Figure 1C:
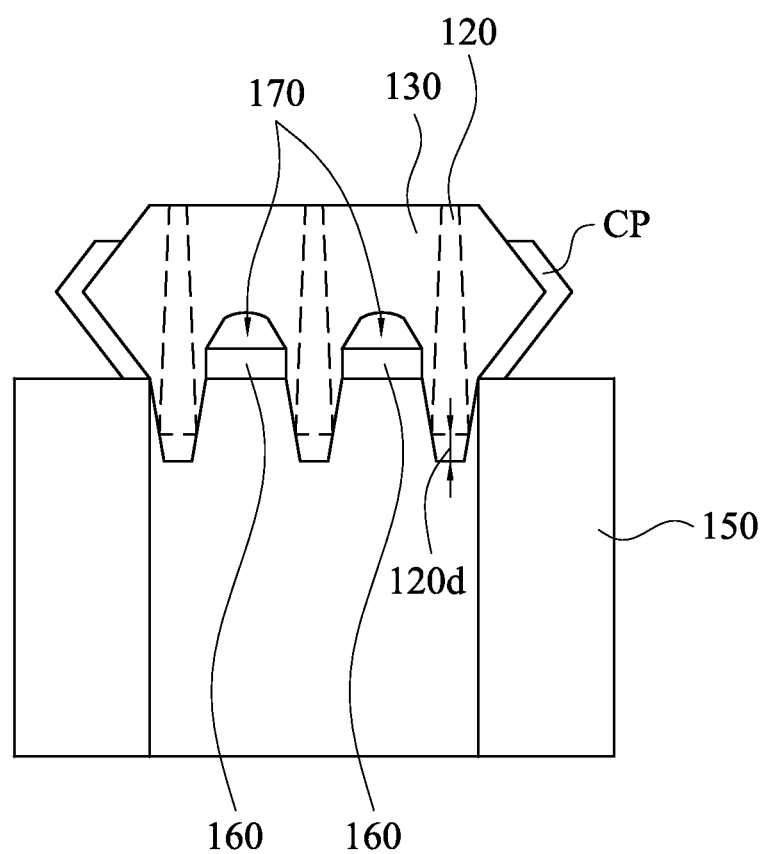
FIG. 1C is a schematic cross-sectional view of the semiconductor device viewed along line CL2-CL2' in FIG. 1A.
Figure 2:
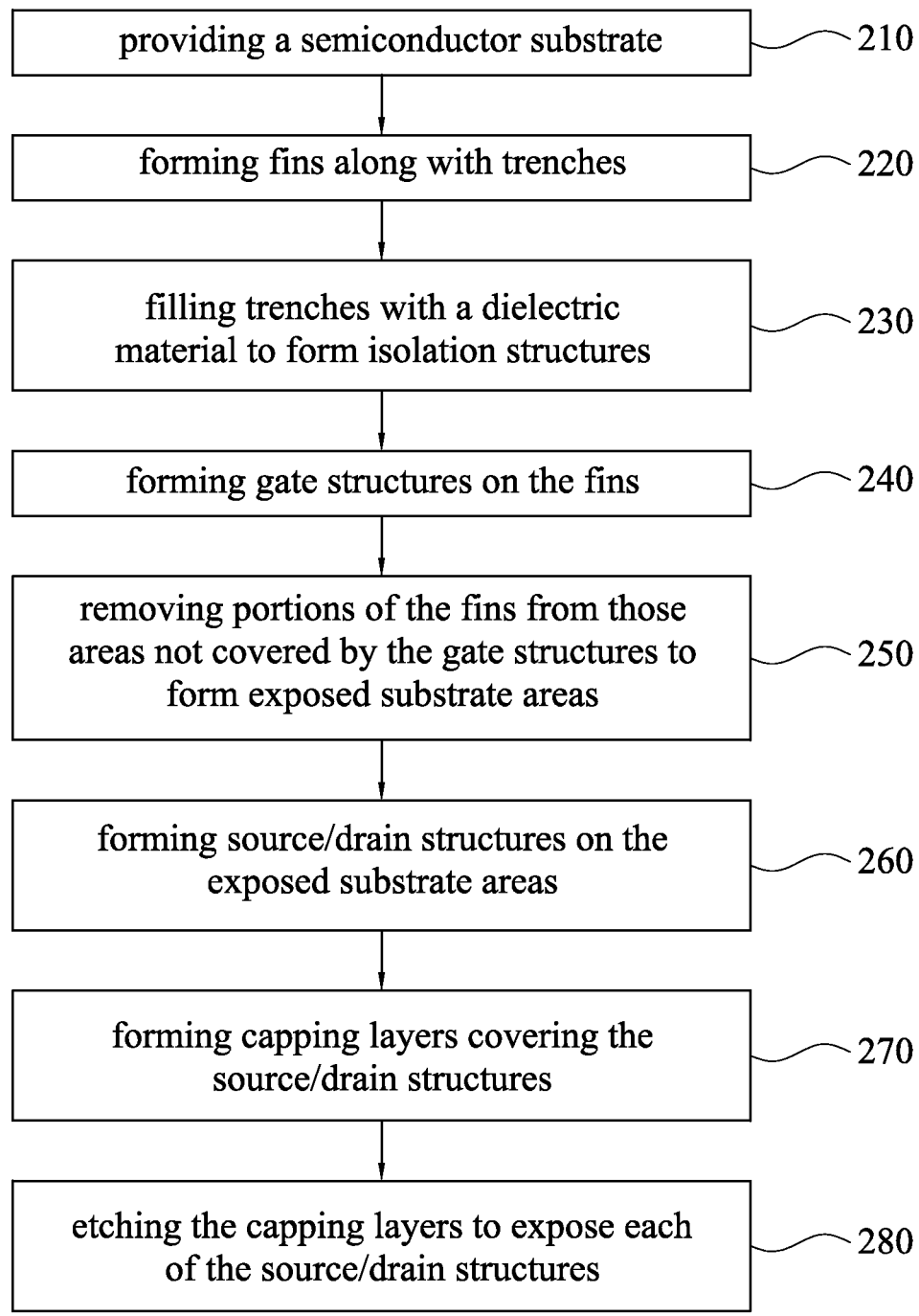
FIG. 2 is a flow chart showing a method for fabricating a semiconductor device in accordance with some embodiments of the present disclosure.

Referring to FIG. 1A through FIG. 1C, FIG. 1A is a schematic three-dimensional diagram showing a semiconductor device 100 in accordance with some embodiments of the present disclosure, FIG. 1B is a cross-sectional view of the semiconductor device 100 viewed along line CL1-CL1' in FIG. 1A, and FIG. 1C is a schematic cross-sectional view of the semiconductor device 100 viewed along line CL2-CL2' in FIG. 1A. The semiconductor device 100 includes a semiconductor substrate 110, plural fins 120 (shown in FIG. 1B), source/drain structures 130, capping layers CP, gate structures 140, isolation structures 150 and 160.

The substrate 110 may be a semiconductor material and may include structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

The isolation structures 150 and 160 are formed on the semiconductor substrate 110. The isolation structures 150 and 160 act as shallow trench isolations (STIs) and may be formed by chemical vapor deposition (CVD) techniques using tetra-ethyl-ortho-silicate (TEOS) and oxygen as a precursor. In some embodiments, the isolation structures 150 and 160 may be formed by implanting ions, such as oxygen, nitrogen, carbon, or the like, into the semiconductor substrate 110. In other embodiments, the isolation structures 150 and 160 are insulator layers of a SOI wafer.

The fins 120, the source/drain structures 130 and the gate structures 140 are formed on the semiconductor substrate 110. The fins 120 connect the source/drain structures 130, and are enclosed by the source/drain structures 130 and the gate structures 140. Each of the gate structures 140 includes a gate electrode stack 142 and two spacers 144, and the spacers 144 are located on sidewalls of the gate electrode stack 142. In some embodiments, the gate electrode stack 142 includes a gate electrode layer 142a and a gate dielectric layer 142b, but embodiments of the present disclosure are not limited thereto.

As shown in FIG. 1B, the fins 120 protrude from the semiconductor substrate 110. The gate electrode layer 142a and the gate dielectric layer 142b of the gate electrode stack 142 are formed on the top surfaces and sidewalls of the fins 120. The isolation structures 160 (also referred to as intra-device isolation structures 160), such as STI structures, are formed between the fins 120, while the intra-device isolation structures 160 are formed to space one FinFET apart from each other. In some embodiments, the fins 120 are formed from the semiconductor substrate 110. For example, the fins 120 are formed from silicon germanium. However, the embodiments of the present disclosure are not limited thereto. In some embodiments, a height 120h of each of the semiconductor fins 120 is ranged substantially from 30 nm to 55 nm, and a thickness 160h of each of the isolation structures 160 is ranged substantially from 2 nm to 15 nm. However, embodiments of the present disclosure are not limited thereof.

As shown in FIG. 1C, the capping layers CP are formed on sidewalls of each of the source/drain structures 130, in which structures enclosed by dotted lines represent the fins 120. In some embodiments a distance 120d between the fin 120 and the bottom of the source/drain structure 130 is ranged substantially from 5 nm to 13 nm.

In some embodiments, the capping layers CP include a low concentration III-V semiconductor, and are lightly impurity-doped, and the source/drain structures 130 include a high concentration III-V semiconductor and are heavily impurity-doped. For example, the capping layers CP include silicon germanium with a low germanium concentration, and are lightly boron-doped, and the source/drain structures 130 include silicon germanium with a high germanium concentration, and are heavily boron-doped. However, the embodiments of the present disclosure are not limited thereto.

A gap 170 is formed between each of the source/drain structures 130 and each of the isolation structures 160. In some embodiments, each of the source/drain structures 130 includes plural sub-portions corresponding to the fins 120, and the gap 170 is located between two adjacent sub-portions. Since the gap 170 can receive air, two different dielectrics (i.e., air and the isolation structures 160) are located between two adjacent fins 120. The gap 170 is configured to prevent out-diffusion of dopant element into the bottoms of the semiconductor fins 120, and produce better intra-fin isolation to reduce leakage current, and prevent the semiconductor fins 120 from bending when the semiconductor fins 120 are too high, and provide better Area/Capacitance performance.

Figure 3A:
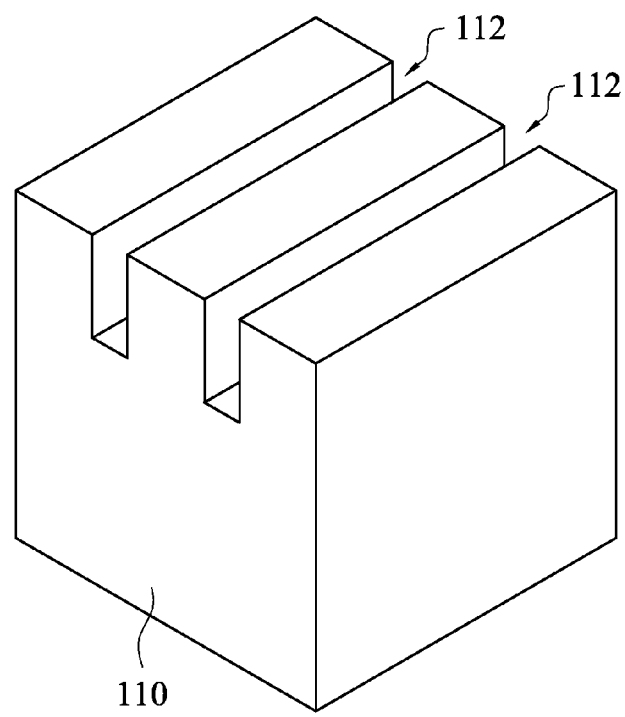
FIG. 3A to FIG. 3K are schematic three-dimensional diagrams and cross-sectional views of intermediate stages showing a method for fabricating a semiconductor device in accordance with some embodiments of the present disclosure.

Referring to FIG. 2 and FIG. 3A to FIG. 3K, FIG. 2 is a flow chart showing a method 200 for fabricating the semiconductor device 100 in accordance with some embodiments of the present disclosure, and FIG. 3A to FIG. 3K are schematic three-dimensional diagrams and cross-sectional views of intermediate stages showing the method 200 for fabricating the semiconductor device in accordance with some embodiments of the present disclosure. In the method 200, at first, operation 210 is performed to provide the semiconductor substrate 110 with trenches 112 formed therein, as shown in FIG. 3A. The trenches 112 may be formed by using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer may be patterned through a suitable photolithographic process to expose those portions of the substrate 110 that will be removed to form the trenches 112.

Figure 3B:
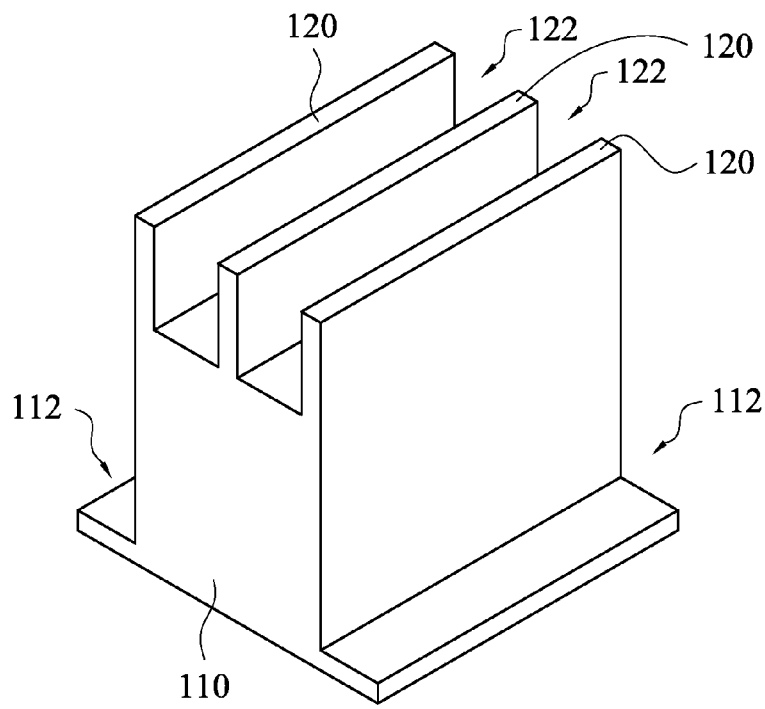

Then, operation 220 is performed to form the fins 120 along with trenches 122, as shown in FIG. 3B. The second trenches 122 are located between the trenches 112, and are intended to be intra-Fin isolation regions, such as isolation regions between separate fins 120 that share either a similar gate or similar sources or drains. The trenches 122 may be formed by using a similar process as the trenches 112, such as a suitable masking or photolithography process followed by an etching process. Additionally, the formation of the trenches 122 may also be used to deepen the trenches 112, such that the trenches 112 extend into the substrate 110 a further distance than the trenches 122.

Figure 3C:
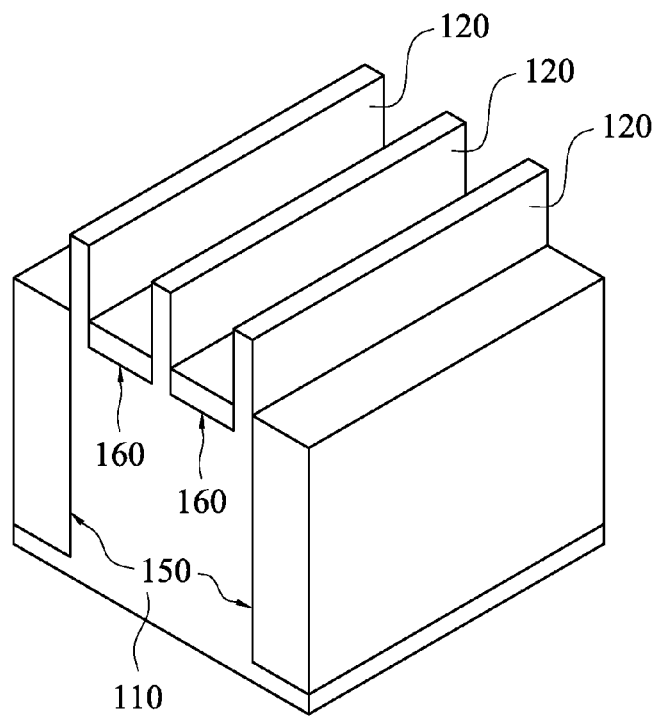

Thereafter, operation 230 is performed to fill the trenches 112 and trenches 122 with a dielectric material to form the isolation structures 150 and the inter-device isolation structures 160, as shown in FIG. 3C. The isolation structures 150 are located in the trenches 112, and the isolation structures 160 are located in the trenches 122. The dielectric material used to form the isolation structures 150 and 160 may be an oxide material, a high-density plasma (HDP) oxide, or the like. The isolation structures 150 and 160 may be formed, after an optional cleaning and lining of the trenches 112 and 122, using either a chemical vapor deposition (CVD) method (e.g., the HARP process), a high density plasma CVD method, or other suitable method of formation as is known in the art.

Figure 3D:
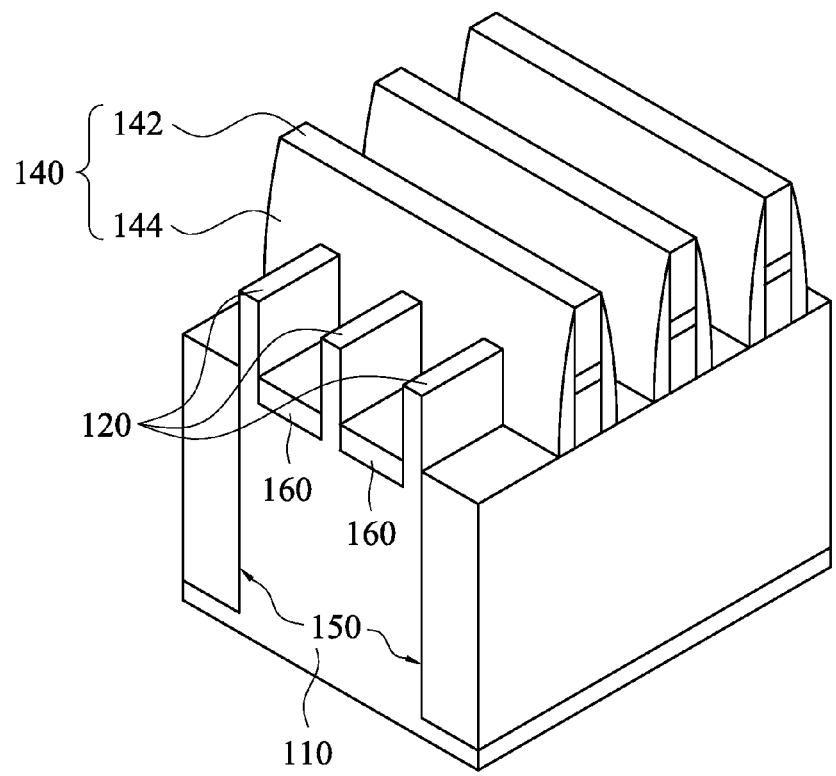

Then, operation 240 is performed to form the gate structures 140 including the gate electrode stack 142 and the spacer 144 on the fins 120, as shown in FIG. 3D. The gate dielectric layer 142b of the gate electrode stack 142 (as shown in FIG. 1B) may be formed by thermal oxidation, chemical vapor deposition, sputtering, or any other methods known and used in the art for forming a gate dielectric. The gate dielectric layer 142b of the gate electrode stack 142 may be formed from a high permittivity (high-k) material (e.g., with a relative permittivity greater than about 5) such as lanthanum oxide, aluminum oxide, hafnium oxide, hafnium oxynitride, or zirconium oxide, or combinations thereof. Additionally, any combination of silicon dioxide, silicon oxynitirde, and/or high-k materials may also be used for the gate dielectric layer 142b.

The gate electrode layer 142a of the gate electrode stack 142 (as shown in FIG. 1B) may be formed from a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode layer 142a may be deposited by chemical vapor deposition (CVD), sputter deposition, or other techniques known and used in the art for depositing conductive materials.

The spacers 144 may be formed from a dielectric material, such as silicon nitride, silicon carbide, silicon oxynitride, other suitable materials, and/or combinations, but embodiments of the present disclosure are not limited thereto. The spacers 144 may be formed by methods utilized to form such a layer, such as chemical vapor deposition (CVD), plasma enhanced CVD, sputter, and other methods known in the art.

The top surface of the gate electrode layer 142a may have a non-planar top surface, and may be planarized prior to patterning of the gate electrode layer 142a. Ions may or may not be introduced into the gate electrode layer 142a at this point. Ions may be introduced, for example, by ion implantation techniques. Once formed, the gate electrode layer 142a and the gate dielectric layer 142b may be patterned to form a series of gate electrode stacks 142 over the fins 120. The gate electrode stacks 142 define multiple channel regions located in the fins 120 underneath the gate dielectric layer 142b. The gate electrode stack 142 may be formed by using, for example, deposition and photolithography techniques known in the art. A gate mask may incorporate commonly used masking materials, such as photoresist material, silicon oxide, silicon oxynitride, and/or silicon nitride, but the embodiments of the present disclosure are not limited thereto. The gate electrode layer 142a and the gate dielectric layer 142b may be etched using a dry etching process to form the patterned gate electrode stack 142. Once the gate electrode stacks 142 are patterned, the spacers 144 are formed. The spacers 144 may be formed on opposing sides of the gate electrode stacks 142. The spacers 144 are typically formed by blanket depositing a spacer layer (not shown) on the previously formed structure. The spacer layer may include SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may include a different material with different etch characteristics than the dielectric material forming the isolation structures 150 and 160 so that the spacers 144 may be used as masks for forming the isolation structures 150 and 160 (described below with references to FIG. 3E). The spacers 144 may then be patterned, such as by one or more etchings operations to remove the spacer layer from the horizontal surfaces of the structure.

Figure 3E:
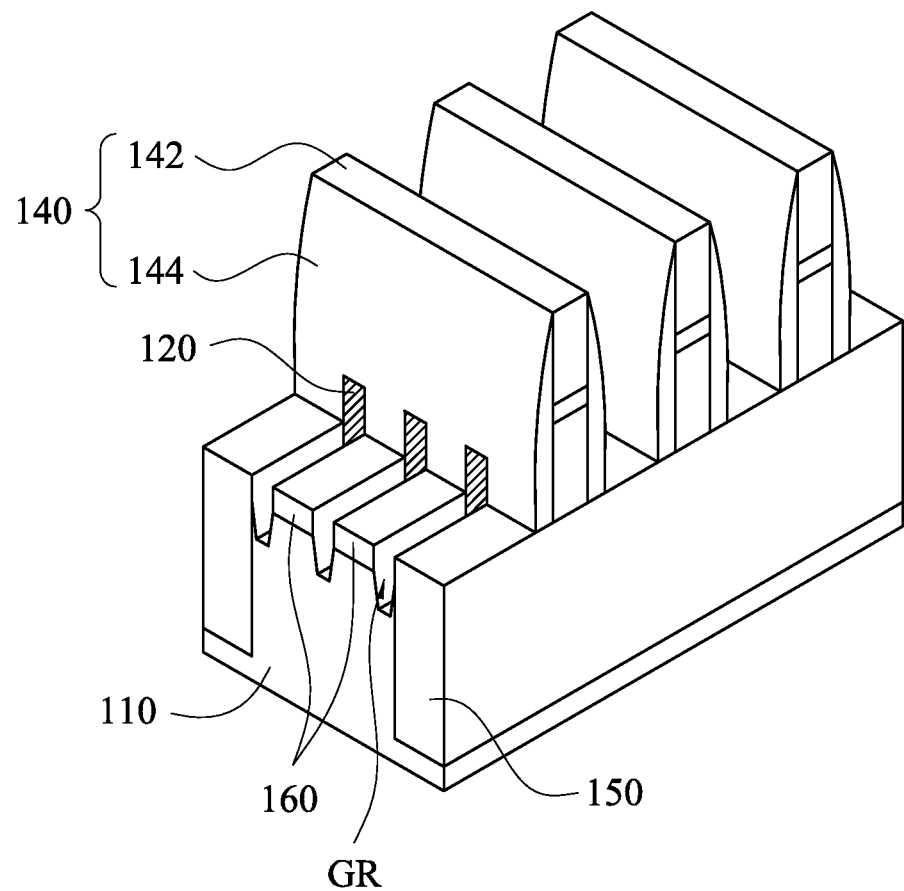

Thereafter, operation 250 is performed to remove portions of the fins 120 from those areas not covered by the gate structures 140, as shown in FIG. 3E, and thus plural grooves GR are formed in the semiconductor substrate 110. In some embodiments, operation 250 may be performed by a reactive ion etch (RIE) by using the gate structures 140 as hardmasks, or by any other suitable removal process.

Figure 3F:
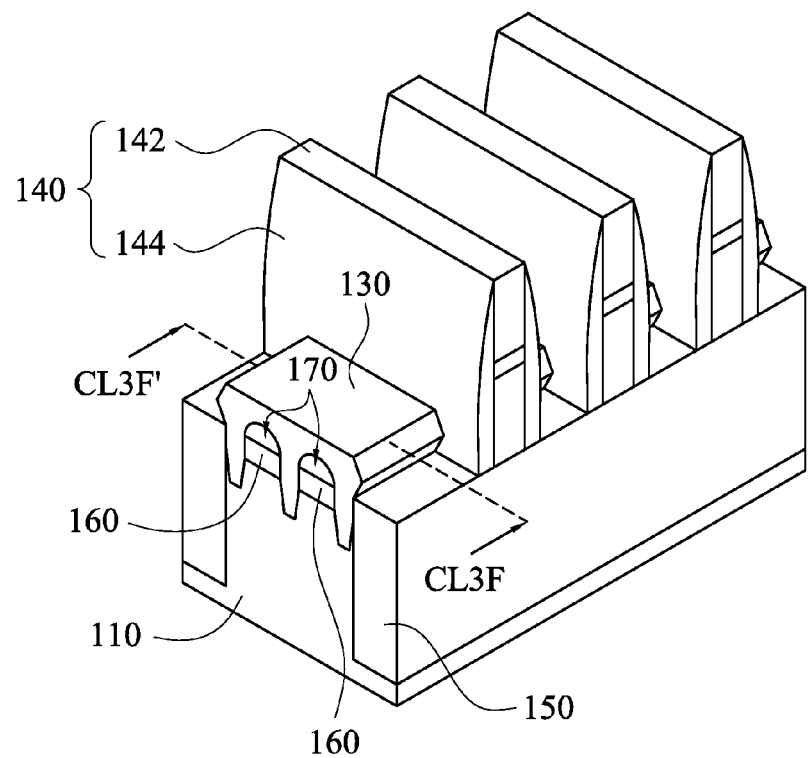
Figure 3G:
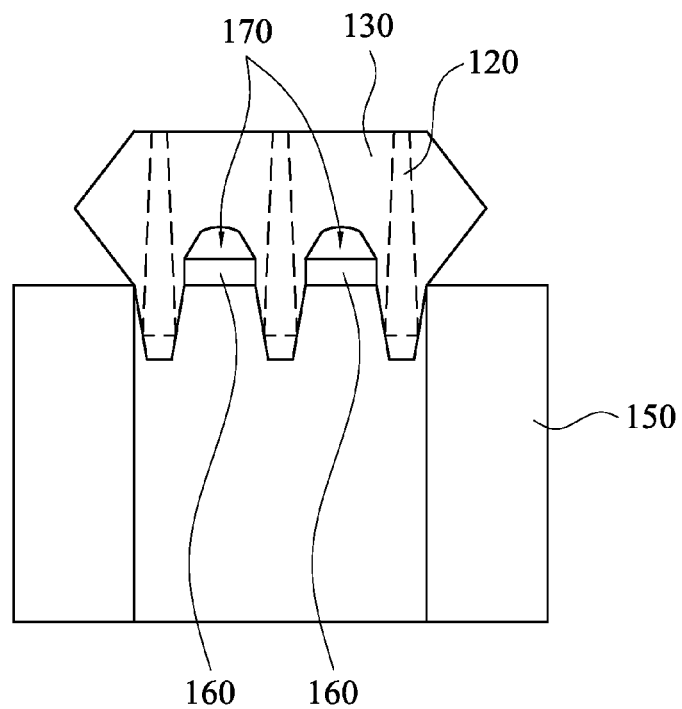

After operation 250, operation 260 is performed to form the source/drain structures 130 on the exposed substrate areas and enable the source/drain structures 130 to be connected to the fins 120, such as shown in FIG. 3F and FIG. 3G, in which FIG. 3G is a schematic cross-sectional view of the semiconductor device viewed along line CL3F-CL3F' in FIG. 3F. In some embodiments, each of the source/drain structures 130 is epitaxially grown from a surface of semiconductor substrate 110 in accordance with a crystal direction <111> or <311>. However, embodiments of the present disclosure are not limited thereto.

Figure 3H:
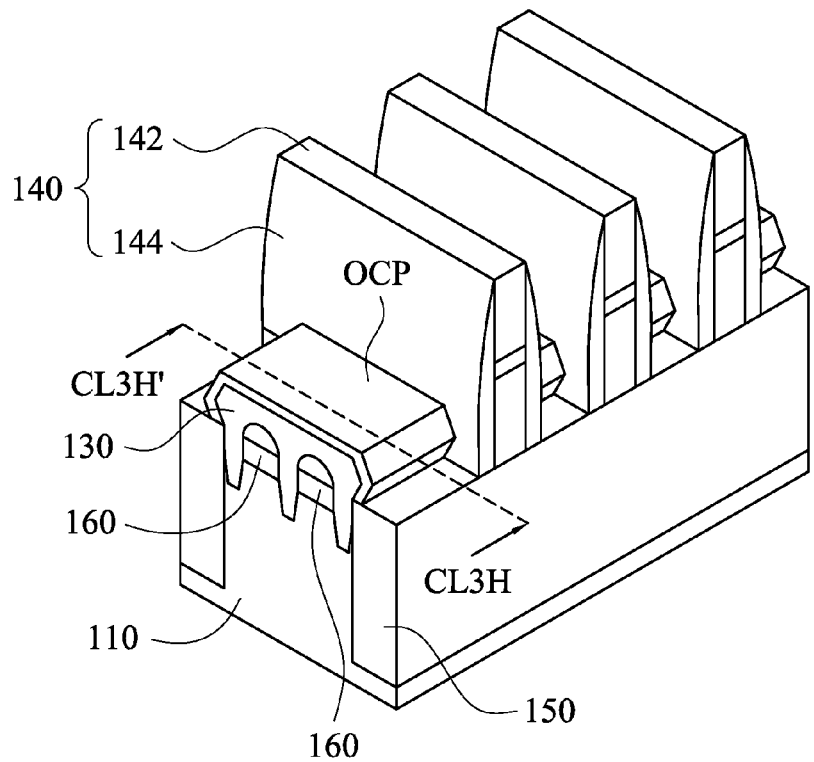
Figure 3I:
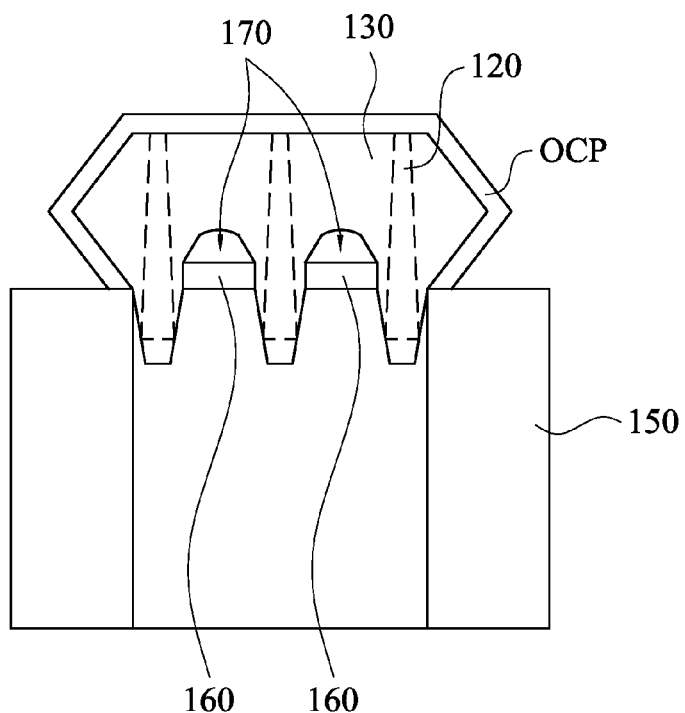

Thereafter, operation 270 is performed to form capping layers OCP to cover the entire source/drain structures 130, as shown in FIG. 3H and FIG. 3I, in which FIG. 3I is a schematic cross-sectional view of the semiconductor device viewed along line CL3H-CL3H' in FIG. 3H. The capping layers OCP are used to protect the source/drain structures 130 in subsequent operations.

Figure 3J:
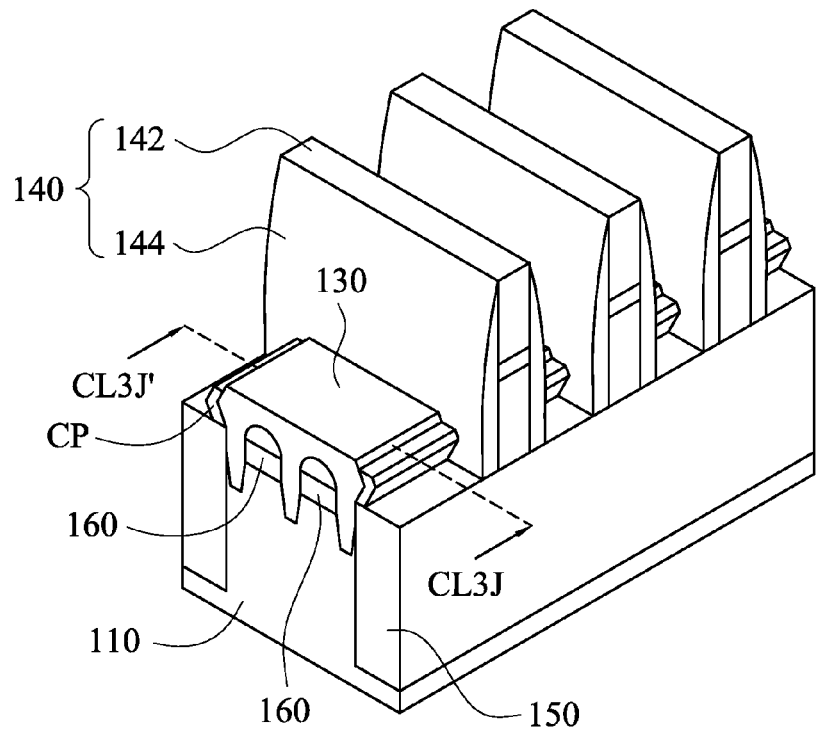
Figure 3K:
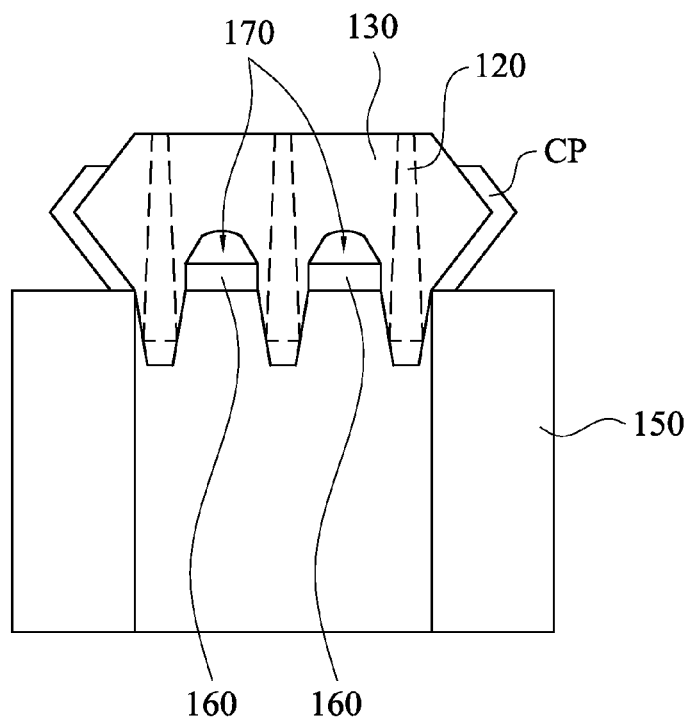
Figure 3L:
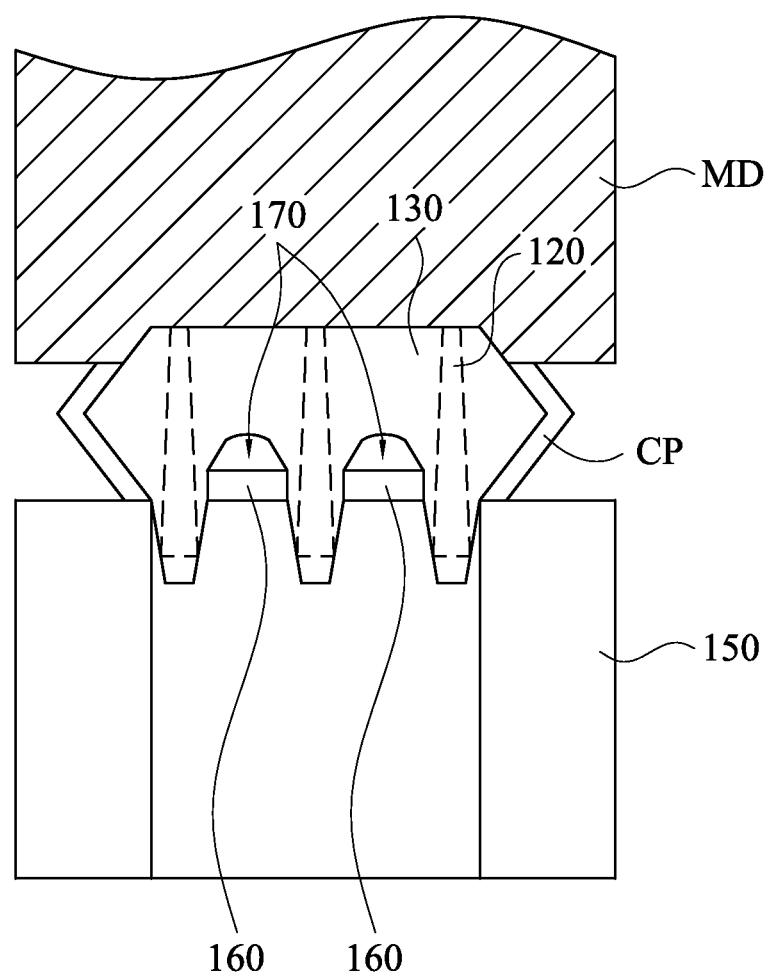
FIG. 3L is a schematic cross-sectional view of a semiconductor device connected with a metal landing in accordance with some embodiments of the present disclosure.

Then, operation 280 is performed to etch portions of the capping layers OCP to expose the top portion of each of the source/drain structures 130, and portions of the capping layers CP on the sidewalls of each of the source/drain structures 130 are formed accordingly, as shown in FIG. 3J and FIG. 3K, in which FIG. 3K is a schematic cross-sectional view of the semiconductor device viewed along line CL3J-CL3J' in FIG. 3J. The exposed top portion is used to provide a contact landing structure. As shown in FIG. 3L, a metal landing MD is disposed on the exposed top portion, thereby connecting the semiconductor device 100 to another device.

Figure 4A:
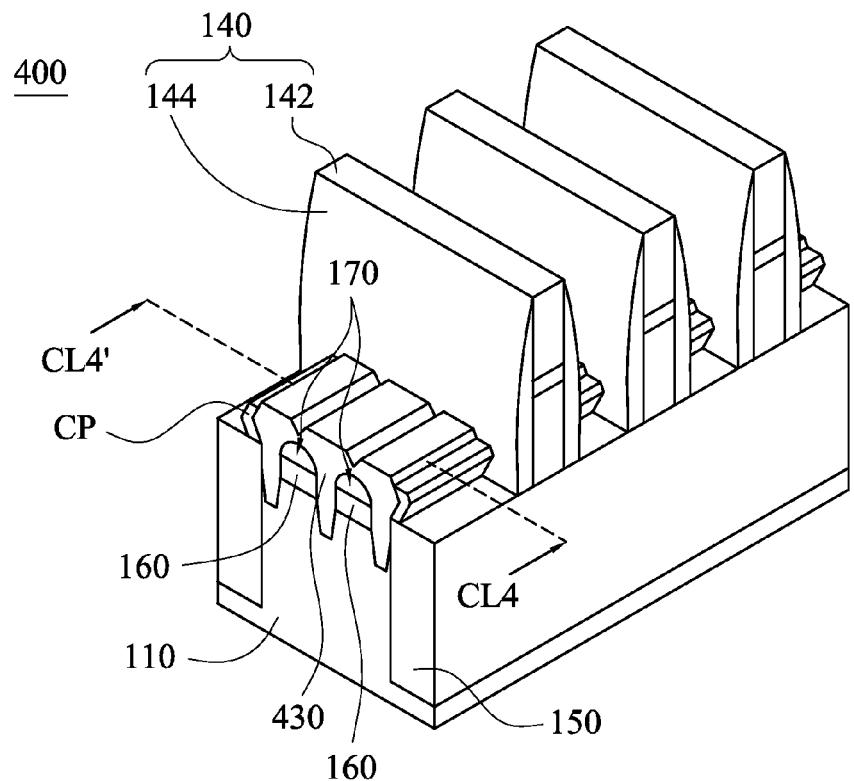
FIG. 4A is a schematic three-dimensional diagram showing a semiconductor device in accordance with some embodiments of the present disclosure.
Figure 4B:
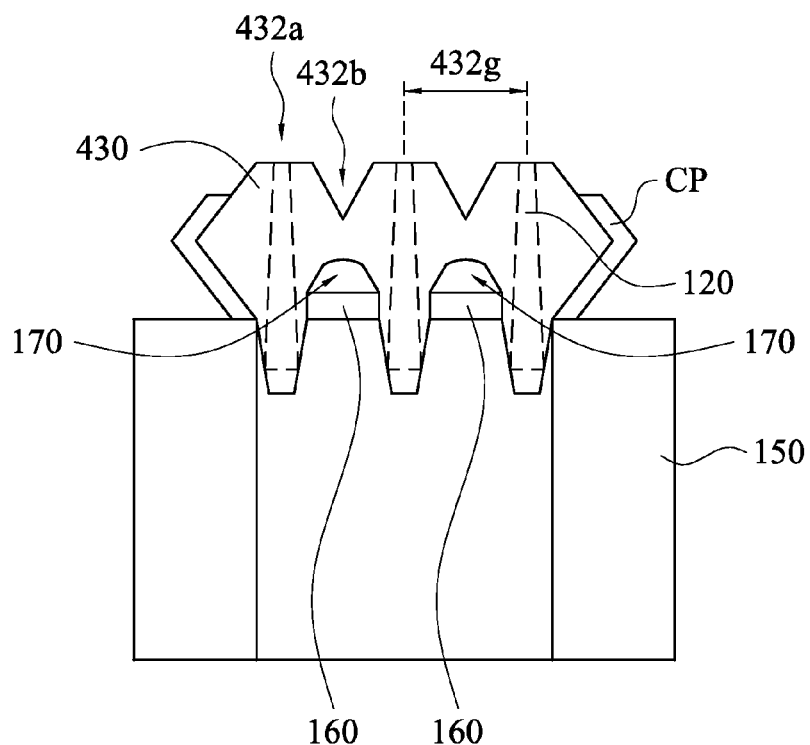
FIG. 4B is a schematic cross-sectional views of the semiconductor device viewed along line CL4-CL4' in FIG. 4A.

Referring to FIG. 4A and FIG. 4B, FIG. 4A is a schematic three-dimensional diagram showing a semiconductor device 400 in accordance with some embodiments of the present disclosure, and FIG. 4B is a schematic cross-sectional views of the semiconductor device 400 viewed along line CL4-CL4' in FIG. 4A. The semiconductor device 400 is similar to the semiconductor device 100, but the difference is in that the semiconductor device 400 includes source/drain structures 430, and each of the source/drain structures 430 of the semiconductor device 400 has a top portion with a wavy cross section, such as a W-shape cross section. The top portion of the source/drain structures 430 has protrusive portions 432a and recessed portions 432b located between every two protrusive portions 432a. The recessed portions 432b are corresponding to the gaps 170 in a one-to-one manner. The protrusive portions 432a are corresponding to the fins 120 in a one-to-one manner. In some embodiments, heights of the protrusive portions 432a are greater than or equal to heights of the fins 120 for connecting the protrusive portions 432a with the fins 120.

With the W-shaped cross section, a contact area between the source/drain structure 430 and a metal landing disposed on the source/drain structure 430 can be increased, and a resistance between the source/drain structure 430 and the metal landing can be decreased accordingly. In some embodiments, a distance 432g between every two adjacent protrusive portions 432a is smaller than substantially 40 nm, but embodiments of the present disclosure are not limited thereto.

Figure 5A:
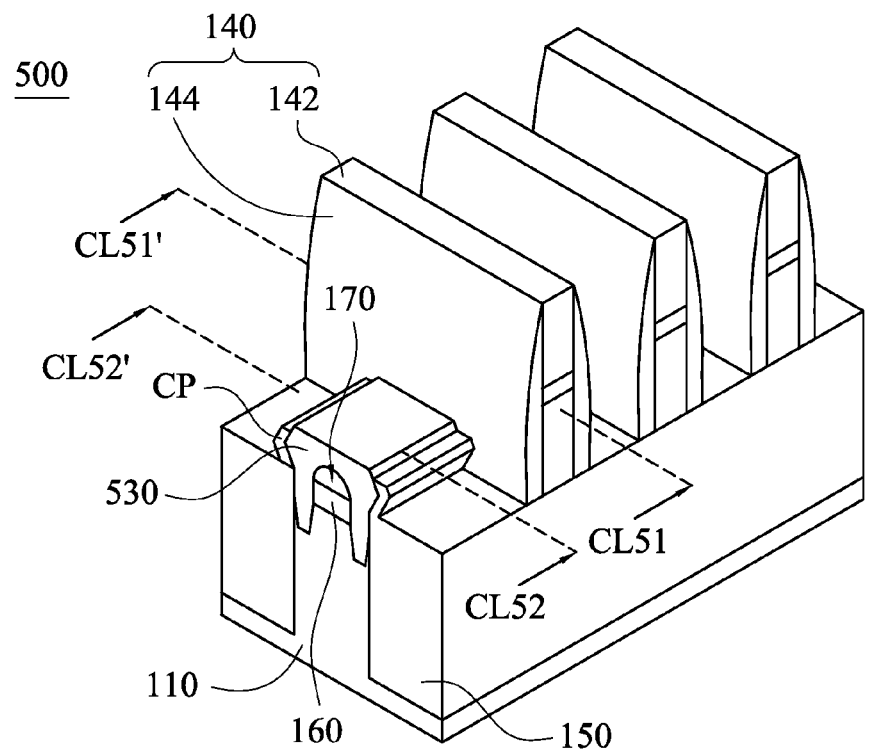
FIG. 5A is a schematic three-dimensional diagram showing a semiconductor device in accordance with some embodiments of the present disclosure.
Figure 5B:
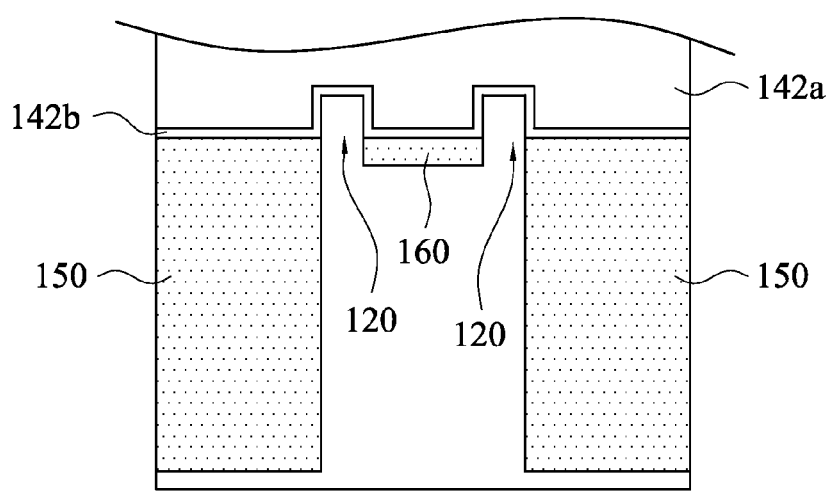
FIG. 5B is a cross-sectional view of the semiconductor device viewed along line CL51-CL51' in FIG. 5A.
Figure 5C:
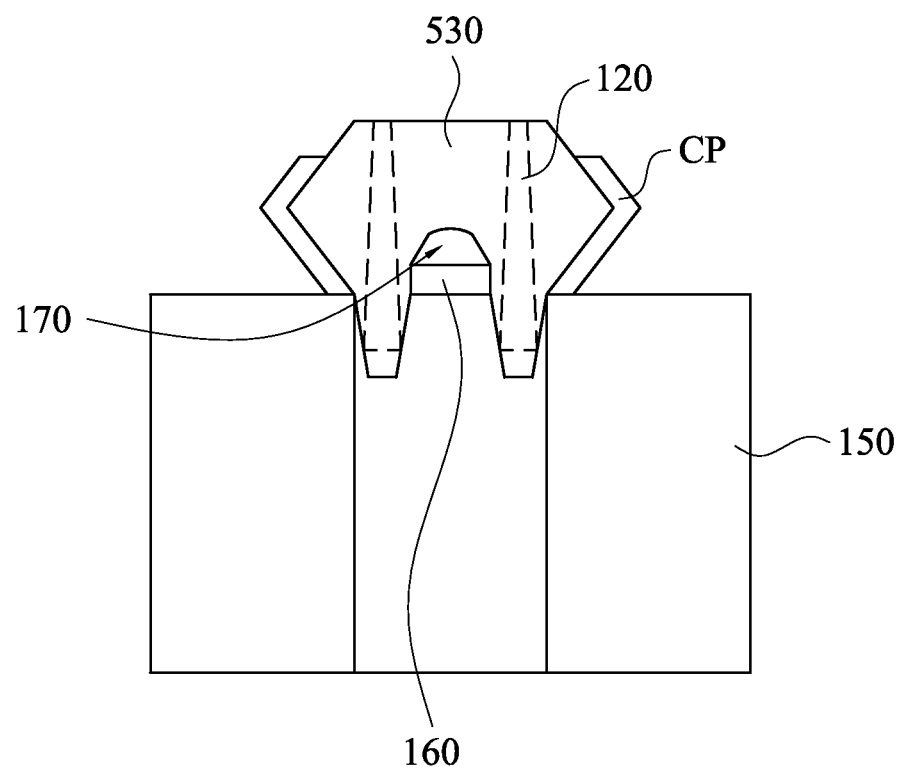
FIG. 5C is a schematic cross-sectional view of the semiconductor device viewed along line CL52-CL52' in FIG. 5A.
Figure 6:
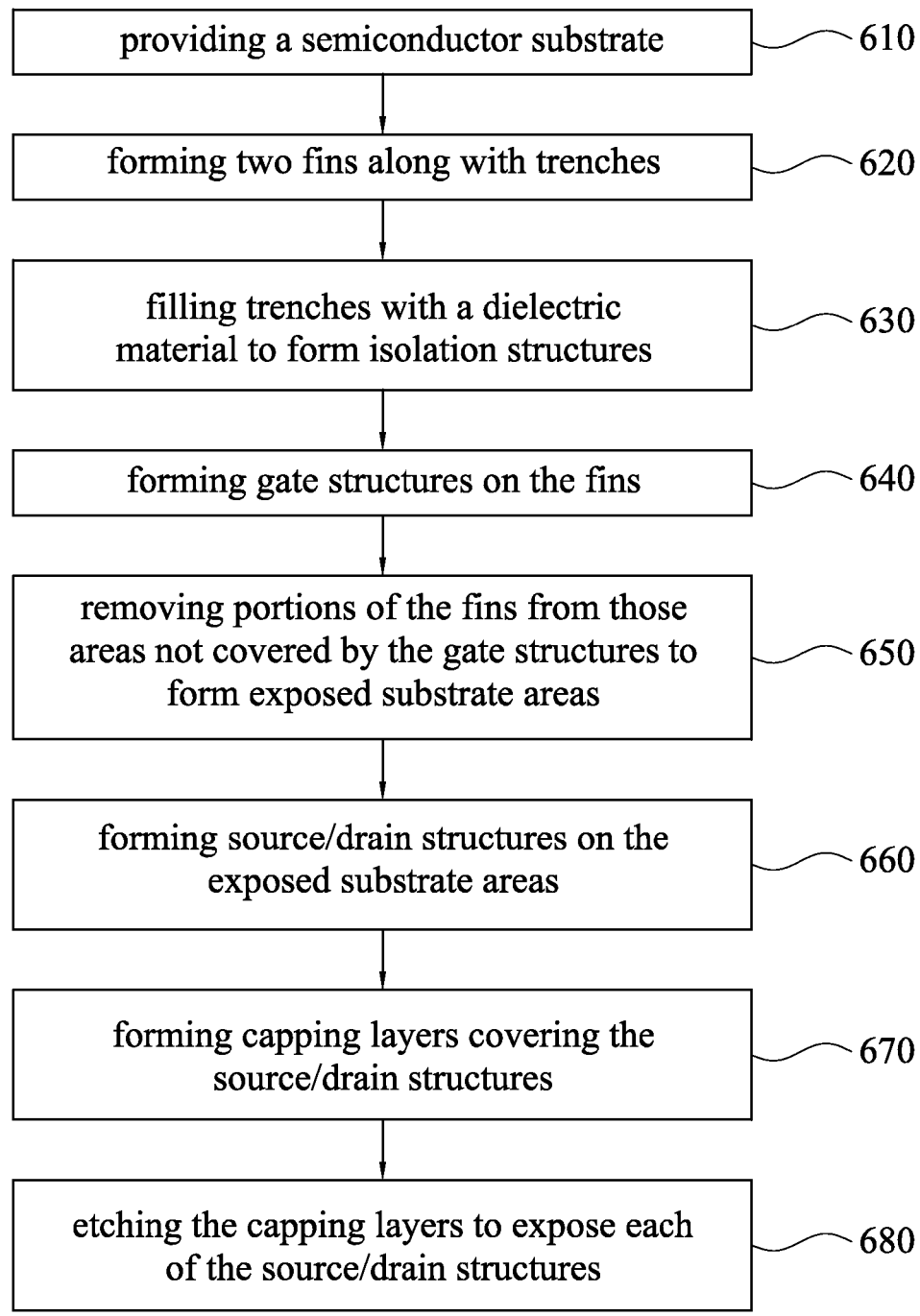
FIG. 6 is a flow chart showing a method for fabricating a semiconductor device in accordance with some embodiments of the present disclosure.

Referring to FIG. 5A through FIG. 5C, FIG. 5A is a schematic three-dimensional diagram showing a semiconductor device 500 in accordance with some embodiments of the present disclosure, FIG. 5B is a cross-sectional view of the semiconductor device 500 viewed along line CL51-CL51' in FIG. 5A, and FIG. 5C is a schematic cross-sectional view of the semiconductor device 500 viewed along line CL52-CL52' in FIG. 5A. The semiconductor device 500 is similar to the semiconductor device 100, but the difference is in that the semiconductor device 500 includes two fins 120 and the source/drain structures 530 corresponding to the two fins 120.

Figure 7A:
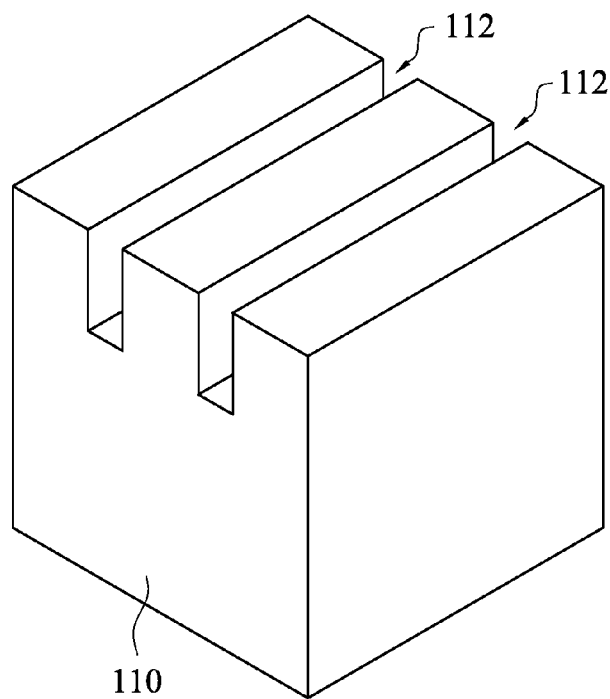
FIG. 7A to FIG. 7K are schematic three-dimensional diagrams and cross-sectional views of intermediate stages showing a method for fabricating a semiconductor device in accordance with some embodiments of the present disclosure.

Referring to FIG. 6 and FIG. 7A to FIG. 7K, FIG. 6 is a flow chart showing a method 600 for fabricating the semiconductor device 500 in accordance with some embodiments of the present disclosure, and FIG. 7A to FIG. 7K are schematic three-dimensional diagrams and cross-sectional views of intermediate stages showing the method 600 for fabricating the semiconductor device in accordance with some embodiments of the present disclosure. In the method 600, at first, operation 610 is performed to provide the semiconductor substrate 110 with trenches 112 formed therein, as shown in FIG. 7A. The trenches 112 may be formed by using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer may be patterned through a suitable photolithographic process to expose those portions of the substrate 110 that will be removed to form the trenches 112.

Figure 7B:
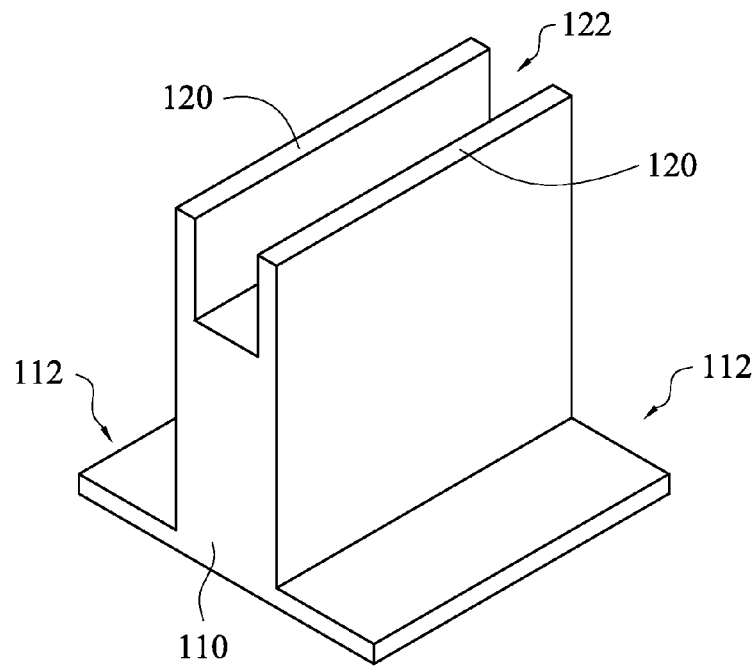

Then, operation 620 is performed to form the fins 120 along with a trench 122, as shown in FIG. 7B. The trench 122 are located between the trenches 112, and are intended to be intra-Fin isolation regions, such as isolation regions between separate fins 120 that share either a similar gate or similar sources or drains. The trench 122 may be formed by using a similar process as the trenches 112, such as a suitable masking or photolithography process followed by an etching process. Additionally, the formation of the trench 122 may also be used to deepen the trenches 112, such that the trenches 112 extend into the substrate 110 a further distance than the trench 122.

Figure 7C:
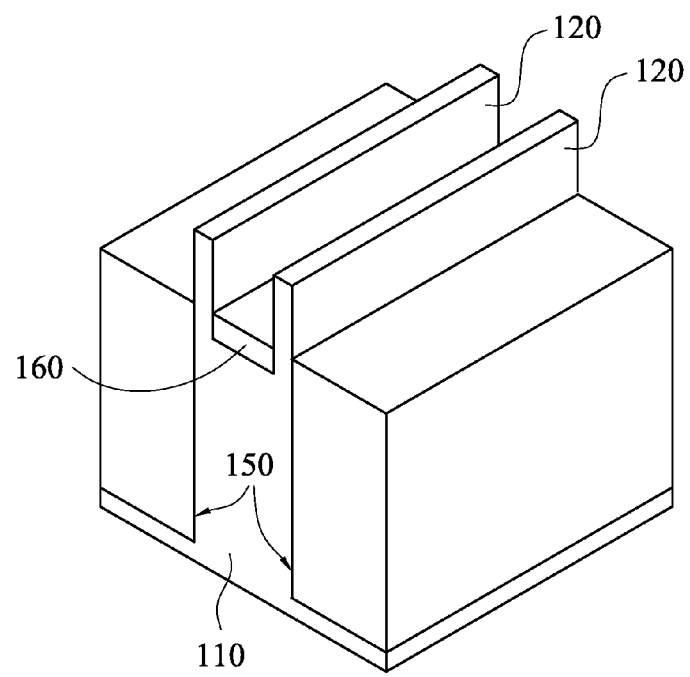

Thereafter, operation 630 is performed to fill the trenches 112 and 122 with a dielectric material to form the isolation structures 150 and the inter-device isolation structure 160, as shown in FIG. 7C. The isolation structures 150 are located in the trenches 112, and the isolation structure 160 is located in the trench 122. The dielectric material used to form the isolation structures 150 and 160 may be an oxide material, a high-density plasma (HDP) oxide, or the like. The isolation structures 150 and 160 may be formed, after an optional cleaning and lining of the trenches 112 and 122, using either a chemical vapor deposition (CVD) method (e.g., the HARP process), a high density plasma CVD method, or other suitable method of formation as is known in the art.

Figure 7D:
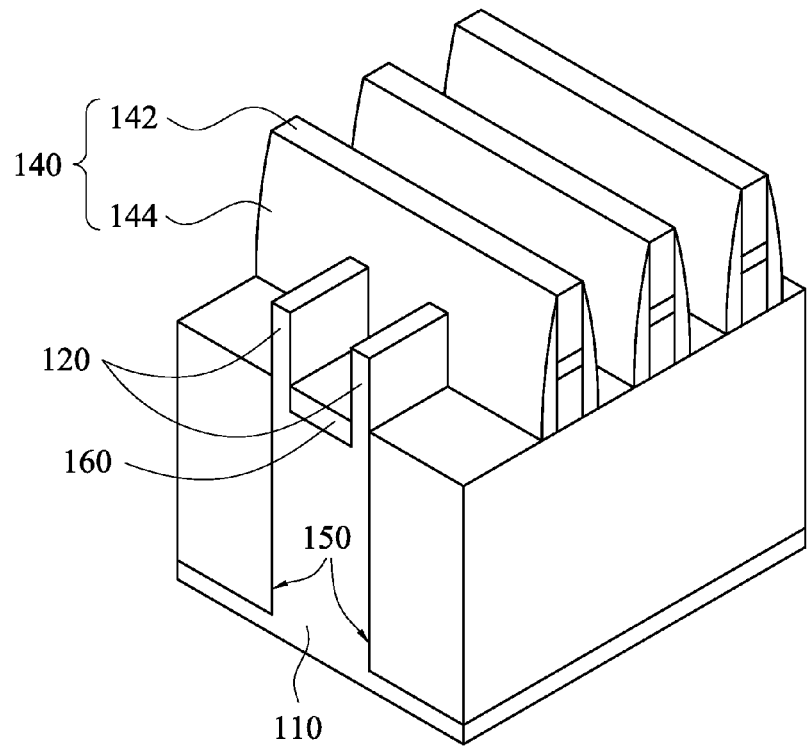

Then, operation 640 is performed to form the gate structures 140 including the gate electrode stack 142 and the spacer 144 on the fins 120, as shown in FIG. 7D. Operation 640 is similar to operation 240, and thus details of operation 640 are not repeated.

Figure 7E:
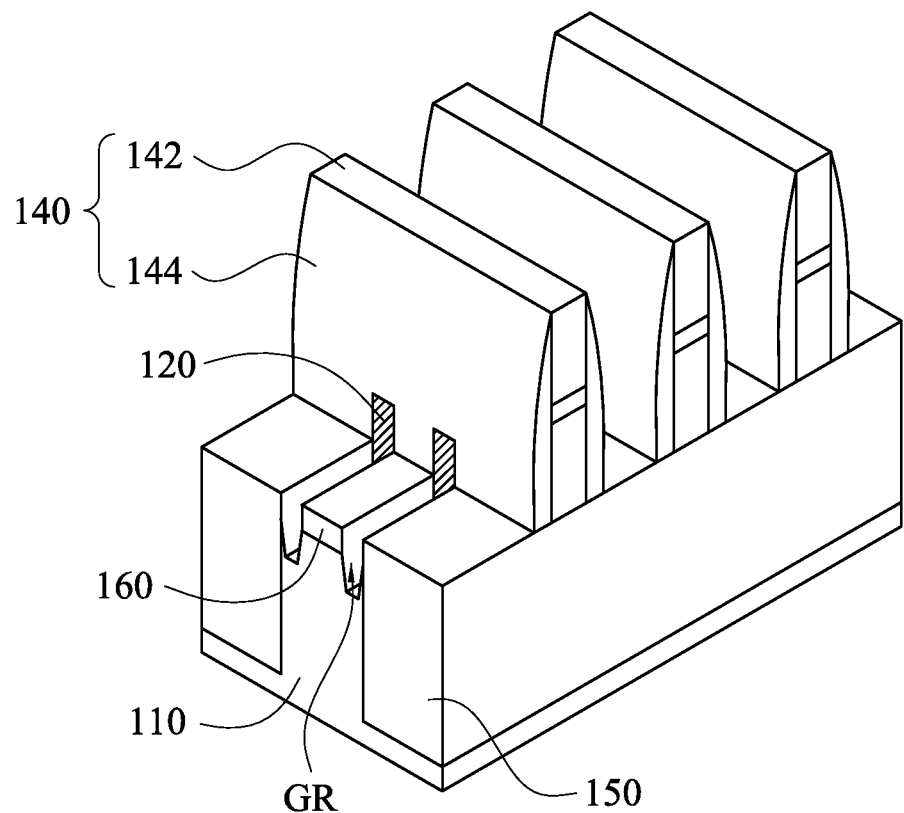

Thereafter, operation 650 is performed to remove portions of the fins 120 from those areas not covered by the gate structures 140, as shown in FIG. 7E, and thus plural grooves GR are formed in the semiconductor substrate 110. In some embodiments, operation 650 may be performed by a reactive ion etch (RIE) by using the gate structures 140 as hardmasks, or by any other suitable removal process.

Figure 7F:
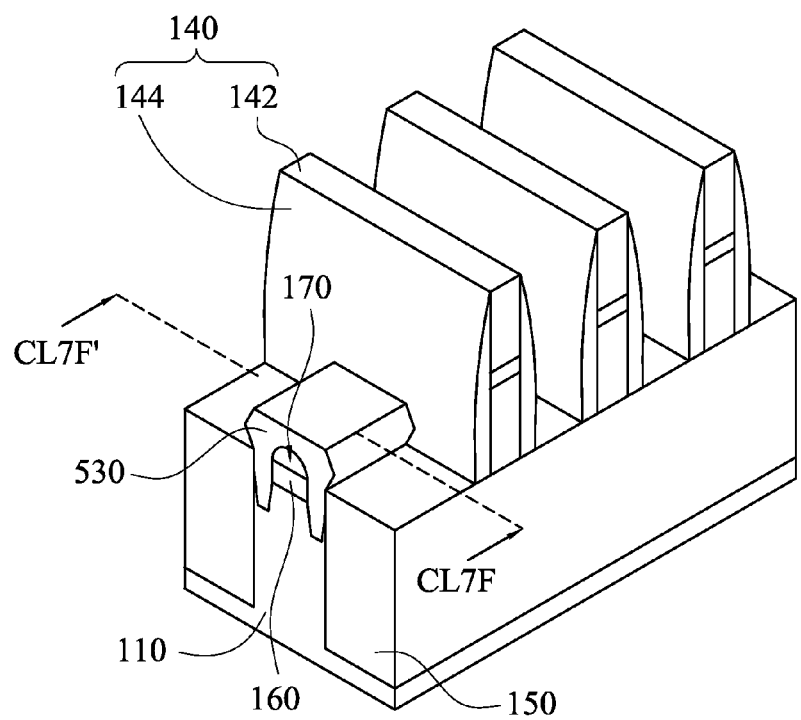
Figure 7G:
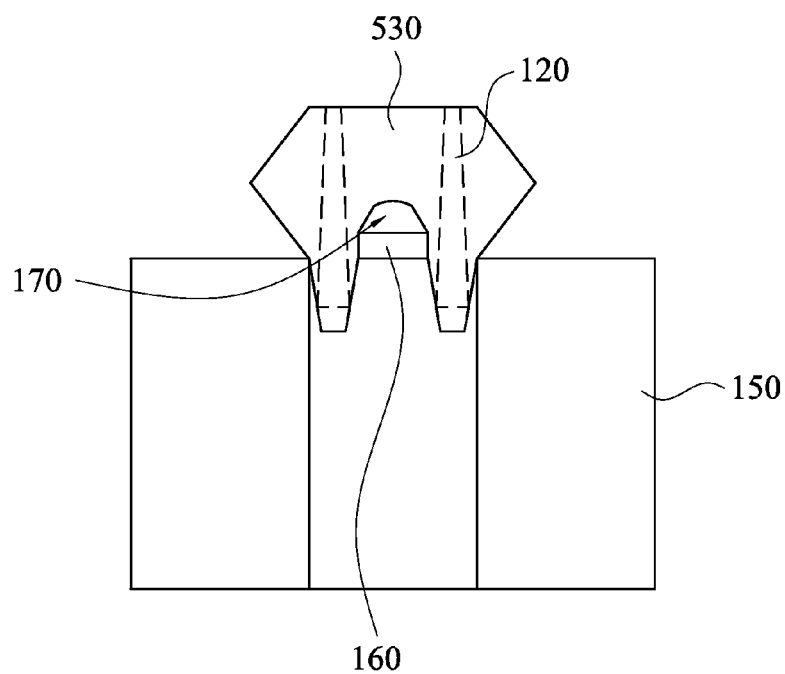

After operation 650, operation 660 is performed to form the source/drain structures 530 on the exposed substrate areas and enable the source/drain structures 530 to be connected to the two fins 120, such as shown in FIG. 7F and FIG. 7G, in which FIG. 7G is a schematic cross-sectional view of the semiconductor device viewed along line CL7F-CL7F' in FIG. 7F. In some embodiments, each of the source/drain structures 530 is epitaxially grown from a surface of semiconductor substrate 110 in accordance with a crystal direction <111> or <311>. However, the embodiments of the present disclosure are not limited thereto.

Figure 7H:
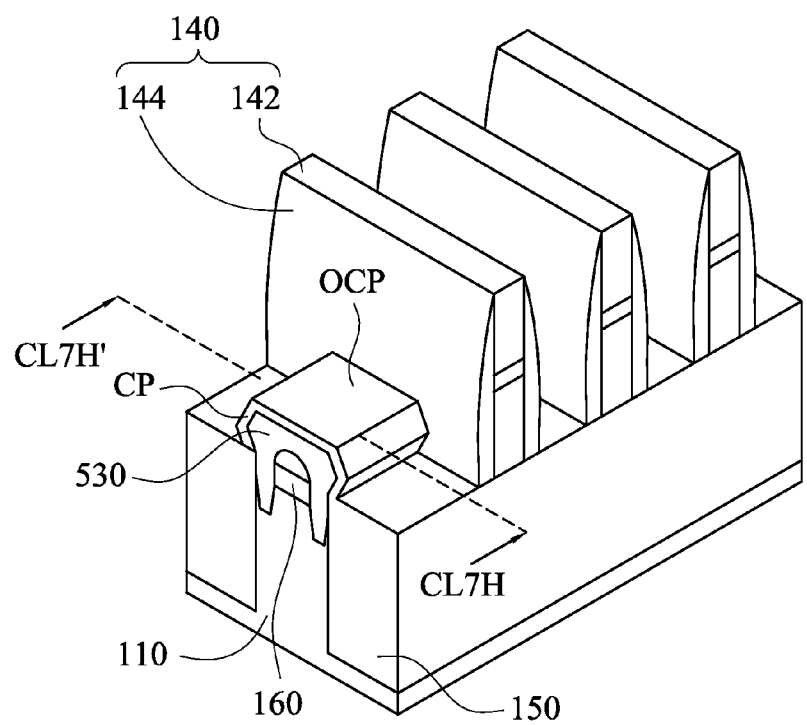
Figure 7I:
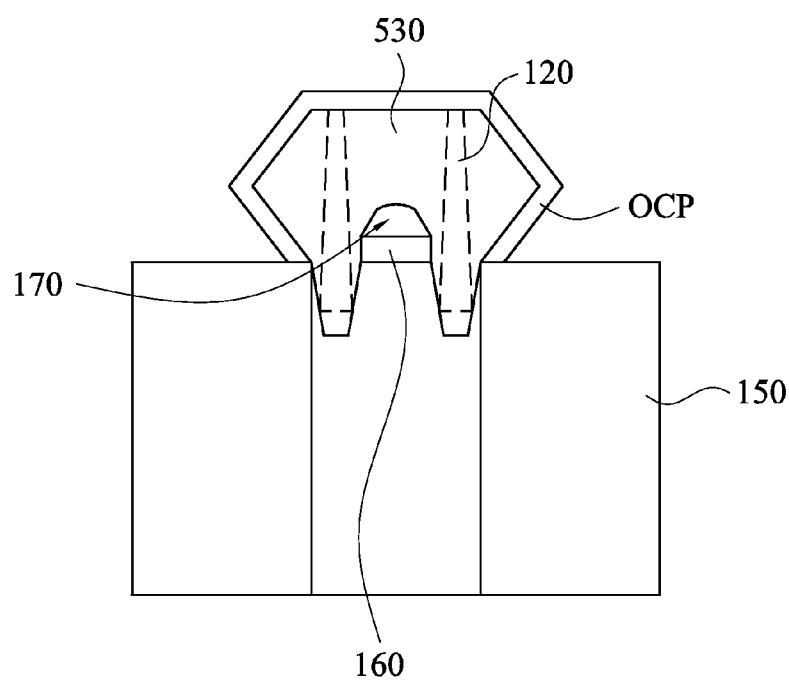

Thereafter, operation 670 is performed to form capping layers OCP to cover the entire source/drain structures 530, as shown in FIG. 7H and FIG. 7I, in which FIG. 7I is a schematic cross-sectional view of the semiconductor device viewed along line CL7H-CL7H' in FIG. 7H. The capping layers OCP are used to protect the source/drain structures 530 in subsequent operations.

Figure 7J:
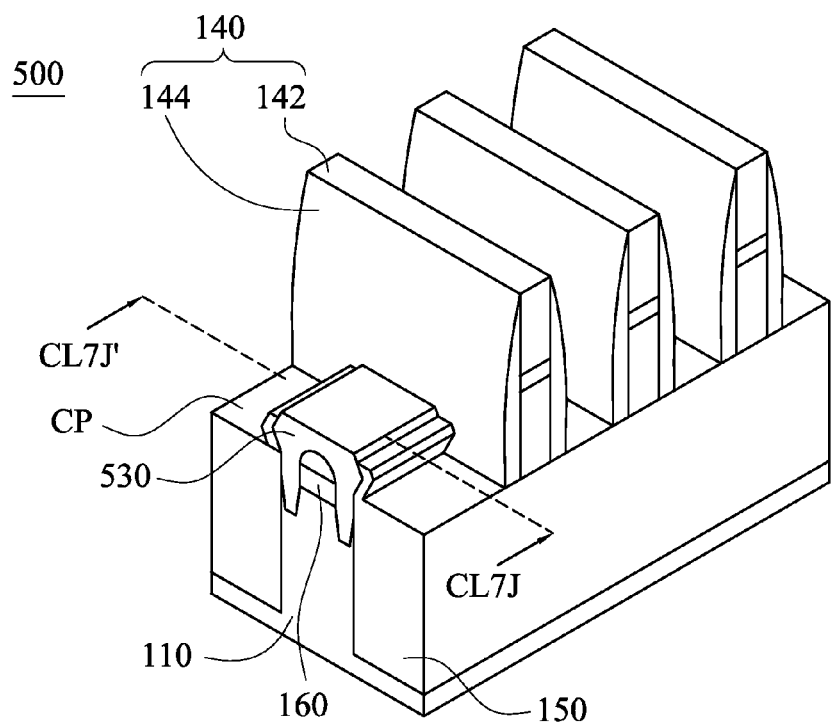
Figure 7K:
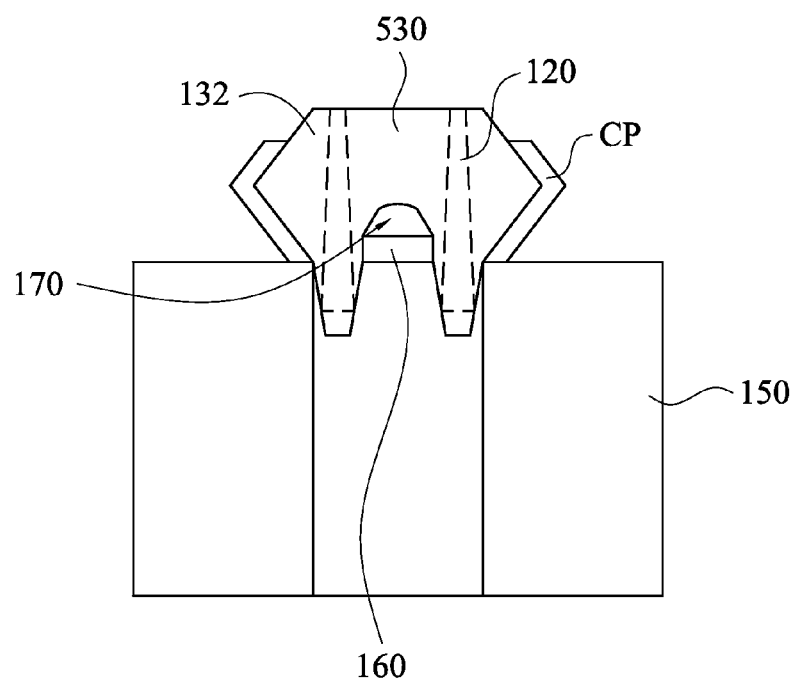
Figure 7L:
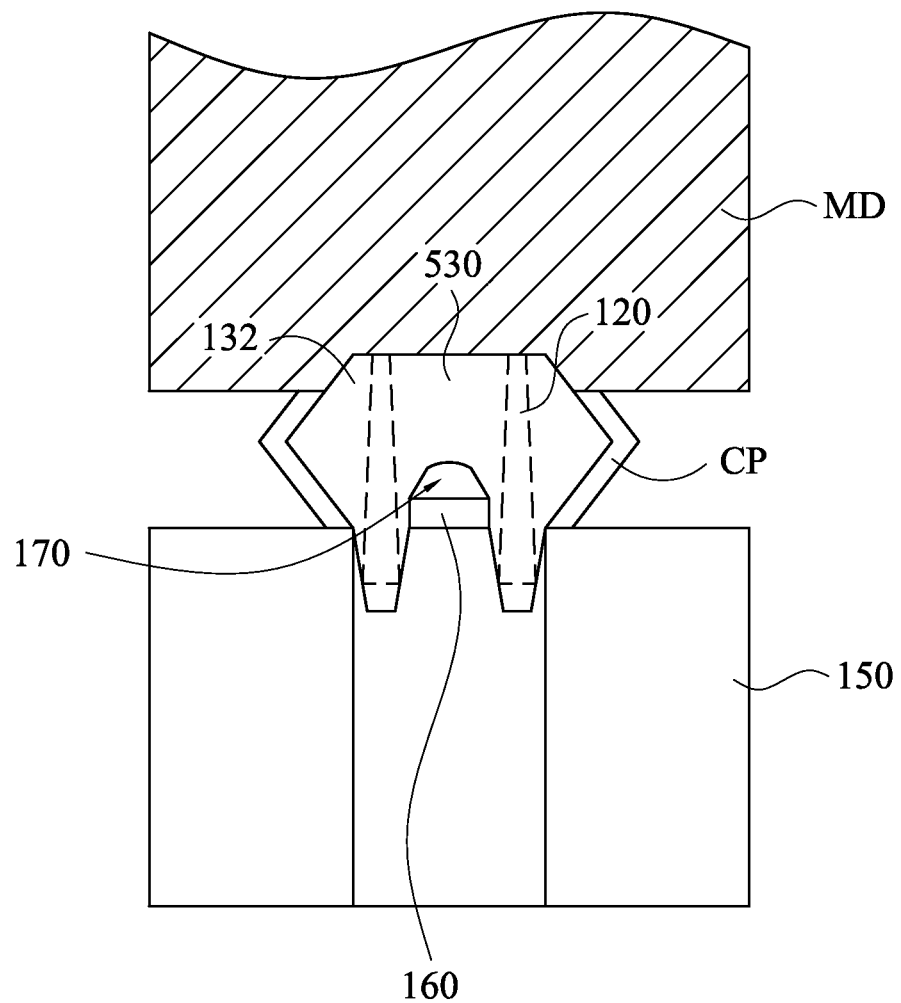
FIG. 7L is a schematic cross-sectional view of a semiconductor device connected with a metal landing in accordance with some embodiments of the present disclosure.

Then, operation 680 is performed to etch portions of the capping layers OCP to expose the top portion of each of the source/drain structures 530, and portions of the capping layers CP on the sidewalls of each of the source/drain structures 530 are formed accordingly, as shown in FIG. 7J and FIG. 7K, in which FIG. 7K is a schematic cross-sectional view of the semiconductor device viewed along line CL7J-CL7J' in FIG. 7J. The exposed top portion is used to provide a contact landing structure. As shown in FIG. 7L, a metal landing MD is disposed on the exposed top portion, thereby connecting the semiconductor device 500 to another device.

In accordance with an embodiment of the present disclosure, the present disclosure discloses a semiconductor device. The semiconductor device includes a semiconductor substrate, at least one first isolation structure, at least one second isolation structure, a source structure, a drain structure and semiconductor fins. The first isolation structure and the second isolation structure are located on the semiconductor substrate. The source structure is located on the semiconductor substrate and the first isolation structure, in which at least one first gap is located between the source structure and the first isolation structure. The drain structure is located on the semiconductor substrate and the second isolation structure, in which at least one second gap is located between the drain structure and the second isolation structure. The semiconductor fins protrude from the semiconductor substrate, in which the semiconductor fins are spaced apart from each other, and connect the source structure and the drain structure.

In accordance with another embodiment of the present disclosure, the present disclosure discloses a fin field-effect transistor (FinFET) device. The FinFET device includes a semiconductor substrate, isolation structures, source/drain structures, semiconductor fins and gate structures. The isolation structures are located on the semiconductor substrate. The source/drain structures are located on the semiconductor substrate and the isolation structures, in which gaps are formed between the source/drain structures and the isolation structures. The semiconductor fins protrude from the semiconductor substrate and connecting the source/drain structures. The gate structures are disposed across the semiconductor fins.

In accordance with yet another embodiment, the present disclosure discloses a method for manufacturing a semiconductor device. In this method, at first, a semiconductor substrate is provided. Then, isolation structures are formed on the semiconductor substrate to space the semiconductor fins apart from each other. Thereafter, gate structures are formed across the semiconductor fins, in which portions of the semiconductor fins are protected by the gate structures. Thereafter, portions of the semiconductor fins not protected by the gate structures are removed. Then, source/drain structures are formed on the semiconductor substrate and the isolation structures, wherein gaps are formed between the source/drain structures and the isolation structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor substrate;
at least one first isolation structure located on the semiconductor substrate;
at least one second isolation structure located on the semiconductor substrate;
a source structure located on the semiconductor substrate and the first and second isolation structures, wherein a bottom surface of the first isolation structure is above at least a portion of the source structure and at least one first air gap is located between the source structure and the first isolation structure;
a drain structure located on the semiconductor substrate and the first and second isolation structures, wherein at least one second air gap is located between the drain structure and the second isolation structure; and
a plurality of semiconductor fins protruding from the semiconductor substrate, wherein the semiconductor fins are spaced apart from each other and connected to the source structure and the drain structure.

2. The semiconductor device of claim 1, wherein the source structure comprises a plurality of sub-portions corresponding to the semiconductor fins in a one-to-one manner, and the first isolation structure is located between the sub-portions.

3. The semiconductor device of claim 1, wherein the drain structure comprises a plurality of sub-portions corresponding to the semiconductor fins in a one-to-one manner, and the second isolation structure is located between the sub-portions.

4. The semiconductor device of claim 1, wherein the source structure has a top portion having a plurality of protrusive portions corresponding to the semiconductor fins in a one-to-one manner and at least one recessed portion on the first isolation structure, and the recessed portion is located between the protrusive portions.

5. The semiconductor device of claim 1, wherein the drain structure has a top portion having a plurality of protrusive portions corresponding to the semiconductor fins in a one-to-one manner and at least one recessed portion on the second isolation structure, and the recessed portion is located between the protrusive portions.

6. The semiconductor device of claim 1, wherein a thickness of each of the first isolation structure and the second isolation structure ranges substantially from 2 nm to 15 nm.

7. A fin field-effect transistor (FinFET) device, comprising:
a semiconductor substrate;
a plurality of isolation structures located on the semiconductor substrate;
a plurality of source/drain structures located on the semiconductor substrate and the isolation structures, wherein air gaps are formed between the source/drain structures and the isolation structures;
a capping layer adjacent to sidewalls of the source/drain structures, wherein a top surface of the source/drain structures is above the capping layer;
a plurality of semiconductor fins protruding from the semiconductor substrate and being spaced apart from each other by the isolation structures and connecting to the source/drain structures; and
a plurality of gate structures disposed across the semiconductor fins.

8. The FinFET device of claim 7, wherein each of the source/drain structures comprises a plurality of sub-portions corresponding to the semiconductor fins in a one-to-one manner, and at least one of the isolation structures is located between the sub-portions.

9. The FinFET device of claim 7, wherein each of the source/drain structures has a top portion having a plurality of protrusive portions corresponding to the semiconductor fins in a one-to-one manner and at least one recessed portion on at least one of the isolation structures, and the recessed portion is located between the protrusive portions.

10. The FinFET device of claim 9, wherein a distance between every two adjacent protrusive portions is substantially smaller than 40 nm.

11. The FinFET device of claim 7, wherein a thickness of each of the isolation structures ranges substantially from 2 nm to 15 nm.

12. The FinFET device of claim 7, wherein each of the gate structures comprises a gate electrode stack and spacers located on sidewalls of the gate electrode stack, and the spacers are formed by silicon nitride.

13. The semiconductor device of claim 4, wherein a distance between every two adjacent protrusive portions of the source structure is substantially smaller than 40 nm.

14. The semiconductor device of claim 4, wherein the source structure has a wavy cross section.

15. The semiconductor device of claim 5, wherein a distance between every two adjacent protrusive portions of the drain structure is substantially smaller than 40 nm.

16. The semiconductor device of claim 5, wherein the drain structure has a wavy cross section.

17. The semiconductor device of claim 1, further comprising a capping layer covering the source structure.

18. The semiconductor device of claim 1, further comprising a capping layer covering the drain structure.

* * * * *